United States Patent
Kyung et al.

Patent Number: 5,791,895
Date of Patent: Aug. 11, 1998

[54] APPARATUS FOR THERMAL TREATMENT OF THIN FILM WAFER

[75] Inventors: Hyun-Su Kyung; Won-Song Choi; Jung-Ho Shin, all of Kyungki-Do, Rep. of Korea

[73] Assignee: Novellus Systems, Inc., San Jose, Calif.

[21] Appl. No.: 564,256

[22] PCT Filed: Feb. 15, 1995

[86] PCT No.: PCT/US95/02008

§ 371 Date: Jun. 10, 1996

§ 102(e) Date: Jun. 10, 1996

[87] PCT Pub. No.: WO95/23427

PCT Pub. Date: Aug. 31, 1995

[30] Foreign Application Priority Data

Feb. 17, 1994 [KR] Rep. of Korea ............. 1994-2820

[51] Int. Cl.⁶ .................................................. F27D 5/00
[52] U.S. Cl. .................. 432/253; 432/258; 34/92; 118/503; 118/729
[58] Field of Search ............... 432/241, 5, 6, 432/253, 152, 258; 34/92; 118/503, 729

[56] References Cited

U.S. PATENT DOCUMENTS

| | | | |
|---|---|---|---|
| 3,755,048 | 8/1973 | Schubert | 156/541 |
| 3,854,443 | 12/1974 | Baerg | 118/49 |
| 3,856,654 | 12/1974 | George | 204/298 |
| 3,961,819 | 6/1976 | Yocum | 294/27 |
| 3,981,791 | 9/1976 | Rosvold | 204/298 |
| 4,431,473 | 2/1984 | Okano et al. | 156/345 |
| 4,457,359 | 7/1984 | Holden | 165/80 |
| 4,473,455 | 9/1984 | Dean et al. | 204/298 |
| 4,512,391 | 4/1985 | Harra | 165/48 |
| 4,522,697 | 6/1985 | Dimock et al. | 204/298 |
| 4,534,816 | 8/1985 | Chen et al. | 156/345 |
| 4,569,745 | 2/1986 | Nagashima | 204/298 |
| 4,591,044 | 5/1986 | Ogami et al. | 198/346.3 |
| 4,607,593 | 8/1986 | Van Hemel | 118/719 |
| 4,631,106 | 12/1986 | Nakazato et al. | 156/345 |
| 4,632,719 | 12/1986 | Chow et al. | 156/345 |
| 4,670,126 | 6/1987 | Messer et al. | 204/298 |
| 4,674,621 | 6/1987 | Takahashi | 198/378 |
| 4,680,061 | 7/1987 | Lamont, Jr. | 148/1.5 |

(List continued on next page.)

FOREIGN PATENT DOCUMENTS

| | | | |
|---|---|---|---|
| 350 752 A2 | 1/1990 | European Pat. Off. | |
| 0 392 516 | 10/1990 | European Pat. Off. | H01L 21/00 |
| 0 430 229 | 6/1991 | European Pat. Off. | H01L 21/285 |
| 452 779 A2 | 10/1991 | European Pat. Off. | |
| 2-238616 | 9/1990 | Japan | H01L 21/27 |
| 91/05887 | 5/1991 | WIPO | C23C 16/00 |
| WO 94/24840 | 11/1994 | WIPO | |
| 95/23427 | 8/1995 | WIPO | |
| 95/30121 | 11/1995 | WIPO | F28F 7/00 |
| 96/07769 | 3/1996 | WIPO | C23C 14/34 |

OTHER PUBLICATIONS

Brunner, R.H., "Wafer Chuck", Jun. 1974, IBM Technical Disclosure Bulletin, vol. 17, No. 1, p. 84.

*Primary Examiner*—John A. Jeffery
*Assistant Examiner*—Jiping Lu
*Attorney, Agent, or Firm*—D'Alessandro & Ritchie

[57] ABSTRACT

An apparatus for thermal treatment of a thin plate wafer having a peripheral edge, having a vacuum chamber, a heater block for heating the thin film wafer rigidly mounted and operatively positioned inside said vacuum chamber, a holding clamp positioned in said vacuum chamber and defining an open-ended cylinder having a bottom and a top, said bottom for receiving said heater block, said holding clamp for pressing against said wafer supported by said heater block; a device for holding the wafer in said open-ended cylinder to enable said holding clamp to hold the wafer prior to and subsequent to thermal treatment of the wafer, an elevator device for positioning said holding clamp relative to said heater block such that in use only said weight of said holding clamp presses against the wafer, and a mechanical device co-operating with the elevator device for supplying and removing wafers into and out of the apparatus.

15 Claims, 5 Drawing Sheets

U.S. PATENT DOCUMENTS

| | | | |
|---|---|---|---|
| 4,693,211 | 9/1987 | Ogami et al. | 118/725 |
| 4,709,655 | 12/1987 | Van Mastrigt | 118/719 |
| 4,747,928 | 5/1988 | Takahashi et al. | 204/298 |
| 4,756,815 | 7/1988 | Turner et al. | 204/298 |
| 4,817,556 | 4/1989 | Mears et al. | 118/503 |
| 4,851,101 | 7/1989 | Hutchinson | 204/298 |
| 4,852,516 | 8/1989 | Rubin et al. | 118/715 |
| 4,856,641 | 8/1989 | Matsumura et al. | 198/346.2 |
| 4,857,704 | 8/1989 | Jannot et al. | 219/354 |
| 4,869,801 | 9/1989 | Helms et al. | 204/298 |
| 4,933,063 | 6/1990 | Katsura et al. | 204/298.03 |
| 4,994,162 | 2/1991 | Armstrong et al. | 204/192.15 |
| 5,002,010 | 3/1991 | Weinberg | 118/719 |
| 5,020,474 | 6/1991 | Tanaka | 118/725 |
| 5,033,538 | 7/1991 | Wagner et al. | 165/80.1 |
| 5,090,900 | 2/1992 | Rudolf et al. | 432/239 |
| 5,131,460 | 7/1992 | Krueger | 165/80.2 |
| 5,177,878 | 1/1993 | Visser | 34/92 |
| 5,202,008 | 4/1993 | Talieh et al. | 204/192.32 |
| 5,222,310 | 6/1993 | Thompson et al. | 34/202 |
| 5,223,112 | 6/1993 | Tepman | 204/298.11 |
| 5,228,501 | 7/1993 | Tepman et al. | 165/80.1 |
| 5,262,029 | 11/1993 | Erskine et al. | 204/298.15 |
| 5,280,894 | 1/1994 | Witcraft et al. | 269/287 |
| 5,281,320 | 1/1994 | Turner et al. | 204/298.15 |
| 5,294,320 | 3/1994 | Somekh et al. | 204/298.11 |
| 5,316,278 | 5/1994 | Sherstinsky et al. | 269/254 |
| 5,403,459 | 4/1995 | Guo | 204/192.32 |
| 5,421,893 | 6/1995 | Perlov | 118/725 |
| 5,458,687 | 10/1995 | Shichida et al. | 118/724 |
| 5,511,608 | 4/1996 | Boyd | 165/80.1 |
| 5,513,594 | 5/1996 | McClanahan et al. | 118/503 |
| 5,556,275 | 9/1996 | Sakata et al. | 432/241 |
| 5,588,827 | 12/1996 | Muka | 432/253 |
| 5,605,866 | 2/1997 | McClanahan et al. | 437/225 |
| 5,680,502 | 10/1997 | Kim | 392/416 |

APPARATUS FOR THERMAL TREATMENT OF THIN FILM WAFER

FIELD OF THE INVENTION

The present invention relates to an apparatus for the thermal treatment of thin film wafers and more particularly to an improved apparatus for the thermal treatment of a thin film wafer, also referred to as a wafer or thin film, comprising a holding clamp for holding the wafer and pressing the edge of the wafer against a heater block, and a wafer supply and removal means for supplying and removing the thin film wafer.

INFORMATION DISCLOSURE STATEMENT

Normally, an apparatus for the process of manufacturing a semiconductor requires development not only of a process to meet the highly dense integration and micronization of semiconductor devices but also of a cluster system having multi-vacuum chambers.

The transfer of a wafer in the above described cluster system results in a low manufacturing yield of highly dense integrated memory devices due to the poor quality of the manufactured wafers because of vibration during the wafer transfer and by contamination due to the presence of impure gas during the transfer.

Especially, a process for forming metal film to connect the wiring of each device in the process of manufacturing a semiconductor requires a new processing technique because of the highly dense integration. Currently a reflow process for the thermal treatment of the thin film wafer at a temperature below its melting point after forming a uniform thin film is being developed and applied. Since such process requires a continuous process performed by the cluster system, the transfer from the cluster system to each vacuum chamber and the supply and removal of wafer from each process chamber are very important steps.

Figure 1:
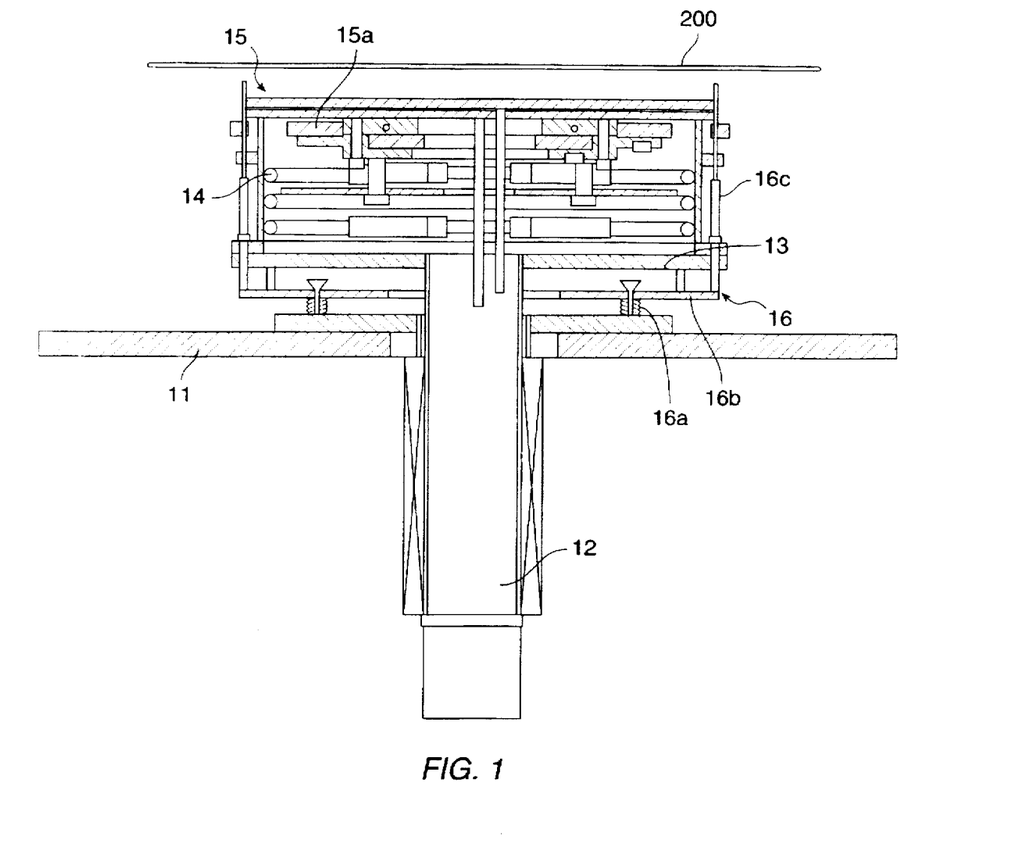
FIG. 1 is a sectional view of a prior art apparatus for the thermal treatment of thin film.

FIG. 1 shows an embodiment of a prior art apparatus for the thermal treatment of thin film in a cluster system or a single chamber system. As illustrated in FIG. 1, a cooling pipe 14 and a heater block 15, having a heater 15a, are positioned above the base plate 13 which is supported by an elevator member 12 within the vacuum chamber 11. The elevator section 16, having a support plate 16b, biased in an upward direction by a plurality of springs 16a, is positioned beneath the support plate 16b and includes a plurality of lift pins 16c with each secured to the edge of the base plate 13 and supported by the outer edge of the heater block. Although not shown in the drawing, a separate supply means is also proved for supplying the thin film to the elevator section 16.

In the thermal treatment of the thin film wafer utilizing the prior art apparatus as described above, the upper end of the lift pin 16c, supported by support plate 16b, is raised to a certain height from the upper surface of the heater block 15 by lowering the elevator member 12. In this condition, the wafer 200 is placed on the upper end of the lift pins 16c by the supplying means, such as a manipulator, so that the lower surface of the wafer 200 is supported by the lift pins 16c. Then the wafer 200, supported on the lift pins 16c, is seated on the heater block 15 by raising the elevator member 12 causing the lift pins 16c to recede. To remove the wafer from the heater block, the above operation is reversed.

However, the apparatus for thermal treatment of the wafer as described above has a problem in that the wafer cannot be stably positioned on or removed from the elevator section as the size of the wafer 200 is increased since the wafer 200 is raised by utilizing the elevator section 16 installed at the center or edge of the heater block 15 and is removed by utilizing the supplying means which is not shown. That is, removal of the wafer becomes difficult as the size of the wafer 200 is increased, since support by the lift pins 16c deteriorates so that when the wafer 200 is seated on the heater block 15 its seating position thereon is misaligned.

In addition, the wafer 200 cannot be properly balanced when supported by the lift pins 16c since the lift pins 16c become deformed due to heat generated by the heater block 15.

Especially, the prior art apparatus for thermal treatment has problems in that the wafer 200 cannot be uniformly heated and the wafer cannot be pushed close to the heater block 15. Also, since the heater block is exposed to the inside of the vacuum chamber, the lower surface of the wafer 200 contacts the heater block at the time of seating and the upper surface of the wafer 200 is exposed to the inside of the vacuum chamber 11.

Figure 2:
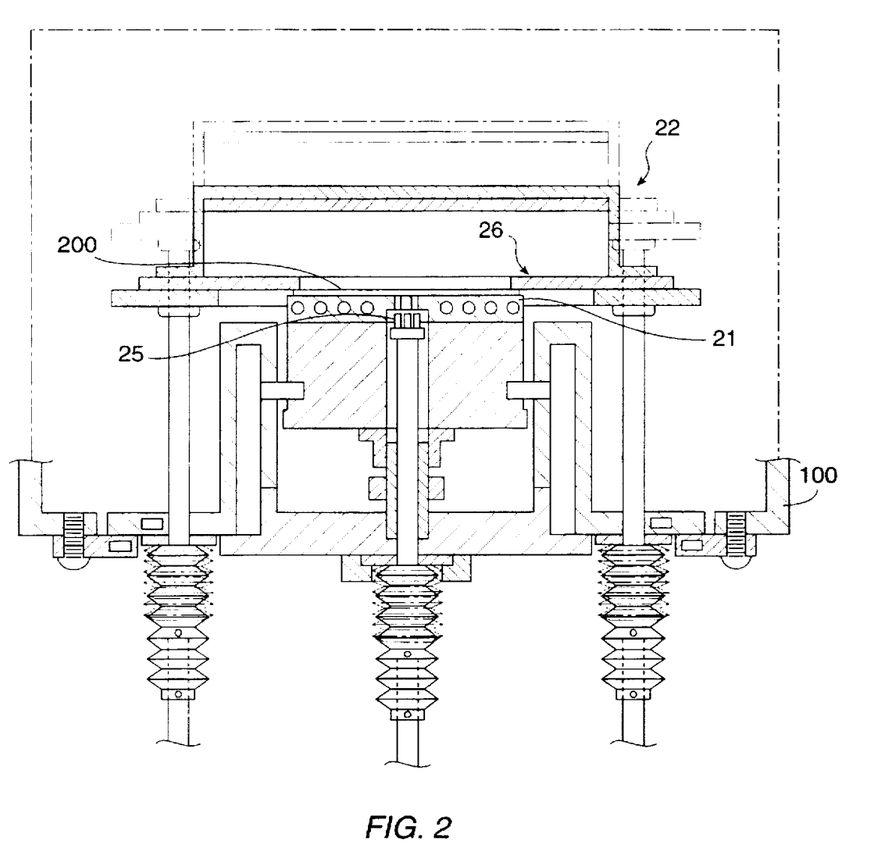
FIG. 2 is a sectional view of an apparatus for the thermal treatment of tin film.

To solve these problems, the present applicant filed Korean patent Application No. 93-6993, filed Apr. 26, 1993, which is directed to improving the apparatus for the thermal treatment of thin film. This apparatus comprises, as shown in FIG. 2, a vacuum chamber 100, a heater table 21 secured inside the vacuum chamber 100, and a heat radiation containment 22 in contact with the heater table 21 for enclosing the wafer 200 seated on the upper surface of the heater table 21. Containment 22 prevents heat radiation by forming a sealed space when in working contact with the upper surface of the heater table 21. Reference numbers 25 and 26 denote a pin and a clamp respectively.

The apparatus for the thermal treatment of thin film constructed as described above has an advantage in that the wafer 200 can be uniformly heated since the heat radiation containment 22 forms a sealed space by enclosing the heater table 21 on which the wafer 200 is seated in the vacuum chamber 100. However, there is still a problem in placing and removing the wafer 200 since elevation of the wafer 200 to be thermally treated is performed by pin 25. The major problem is that the wafer 200 is deformed since the pushing force of the wafer 200 against the heater table 21 is not uniform since the edge of the clamp 26 pushes the edge of the wafer with the pushing force of the clamp 26 supported on a rod of the heat radiation containment 22 so that the wafer 200 is pushed against the heater table 21 unevenly.

SUMMARY OF THE INVENTION

The present invention solves the above described problems. An object of the present invention is to provide an apparatus, for the thermal treatment of a thin film wafer which increases quality and improves the efficiency of the operation of the apparatus by preventing deformation of a wafer at the time of supplying and removing the wafer to and from the apparatus.

Another object of the present invention is to provide an apparatus for the thermal treatment of thin film which uniformly presses the wafer against the heater block.

To achieve such objects, the present invention is characterized in that it comprises a vacuum chamber, a heater block positioned in the vacuum chamber, a holding clamp for supporting a thin film wafer and having sufficient weight to press the wafer against the heater block during use, a wafer supply means for supplying the wafer to the holding clamp, and an elevator means for moving the holding clamp supporting the thin film wafer toward and away from the heater block.

The apparatus of the present invention is defined by the claims with a specific embodiment shown in the attached drawings. For the purpose of summarizing the invention, the invention relates to an apparatus for thermal treatment of a thin plate wafer having a peripheral edge and comprises a vacuum chamber and a heater block for heating the thin film wafer operatively positioned inside the vacuum chamber. A holding clamp is positioned in the vacuum chamber and defines an open-ended cylinder 40 having a bottom 44 and a top 42. The top of the open-ended cylinder further includes a circumferential flange 63 and the bottom is open to permit in use the entry and exit of the heater block therethrough upon the holding clamp being raised and lowered. The holding clamp further includes a specific weight for pressing against, in use, the wafer when the wafer is supported by the heater block during thermal treatment of the wafer. Means for holding the wafer 72 in the open-ended cylinder are needed to enable, in use, the holding clamp to hold the wafer prior to and subsequent to thermal treatment of the wafer, that is, prior to and subsequent to the wafer being positioned on the heater block for thermal treatment. An elevator means moves the holding clamp toward and away from the heater block. To initiate treatment the elevator means is activated such that the holding clamp moves toward the heater block permitting the heater block to enter the bottom of the holding clamp and contact the wafer held by the holding clamp until the heater block fully engages and supports the wafer. Upon continued activation of the elevator means the circumferential flange of the holding clamp engages the peripheral edge of the wafer and upon further continued activation of the elevator means the holding clamp is positioned on the peripheral edge of the wafer. At this position the weight of the holding clamp presses against the peripheral edge of the wafer and is entirely supported by the heater block. Upon completion of thermal treatment, the elevator means is activated to move the holding clamp away from the heater block, in effect withdrawing the heater block from the holding clamp. Such movement permits removal of the thermally treated wafer from the holding clamp. Means for holding the wafer include a plurality of fingers, ledges and the like.

The more pertinent and important features of the present invention have been outlined above in order that the detailed description of the invention which follows will be better understood and that the present contribution to the art can be fully appreciated. Additional features of the invention described above and hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

A detailed explanation of a preferred embodiment of the present invention with reference to the accompanying drawings is described below. FIGS. 1 and 2 are discussed above.

Figure 3:
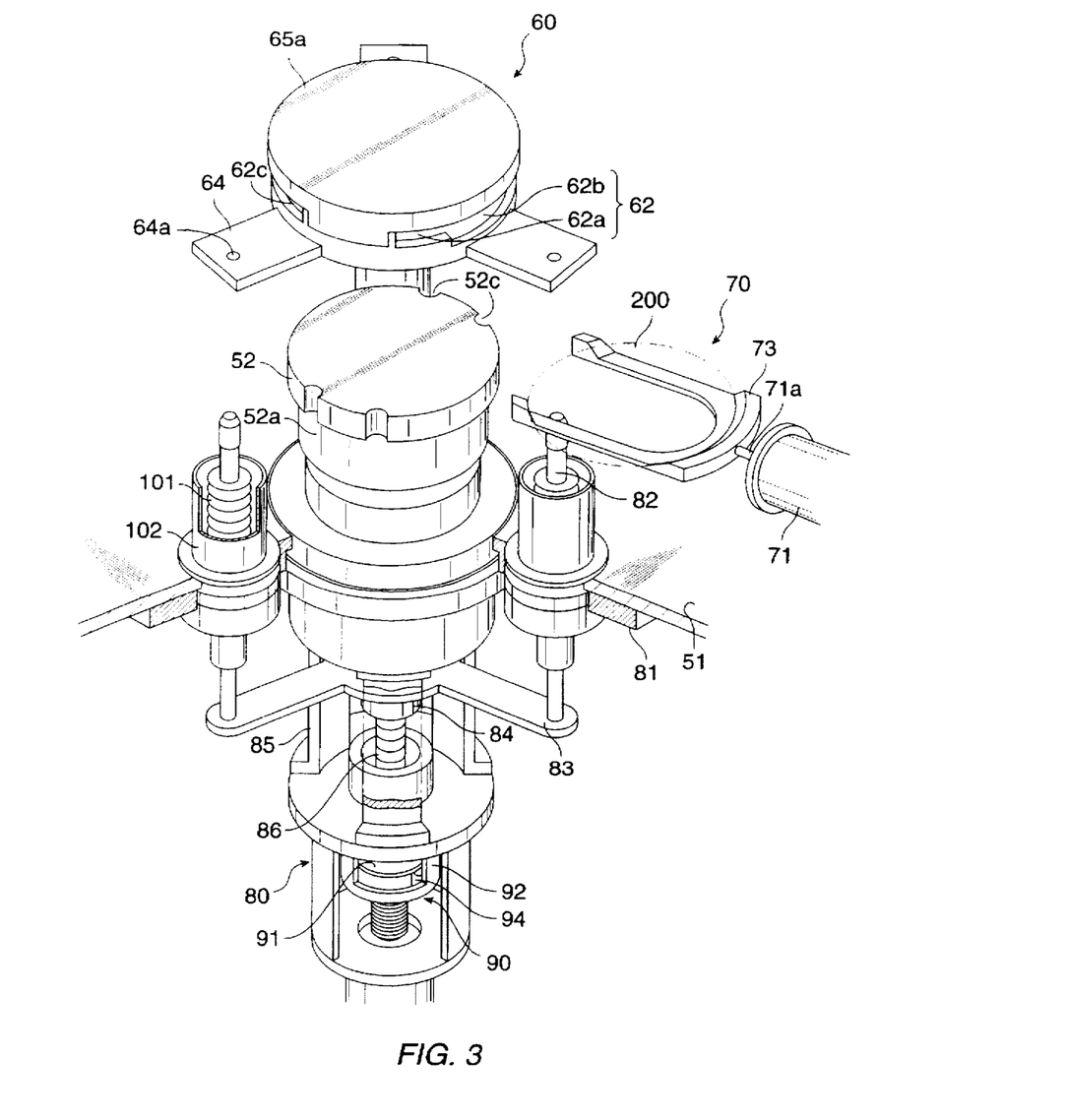
FIG. 3 is a perspective drawing showing an apparatus for the thermal treatment of thin film according to the present invention.
Figure 4:
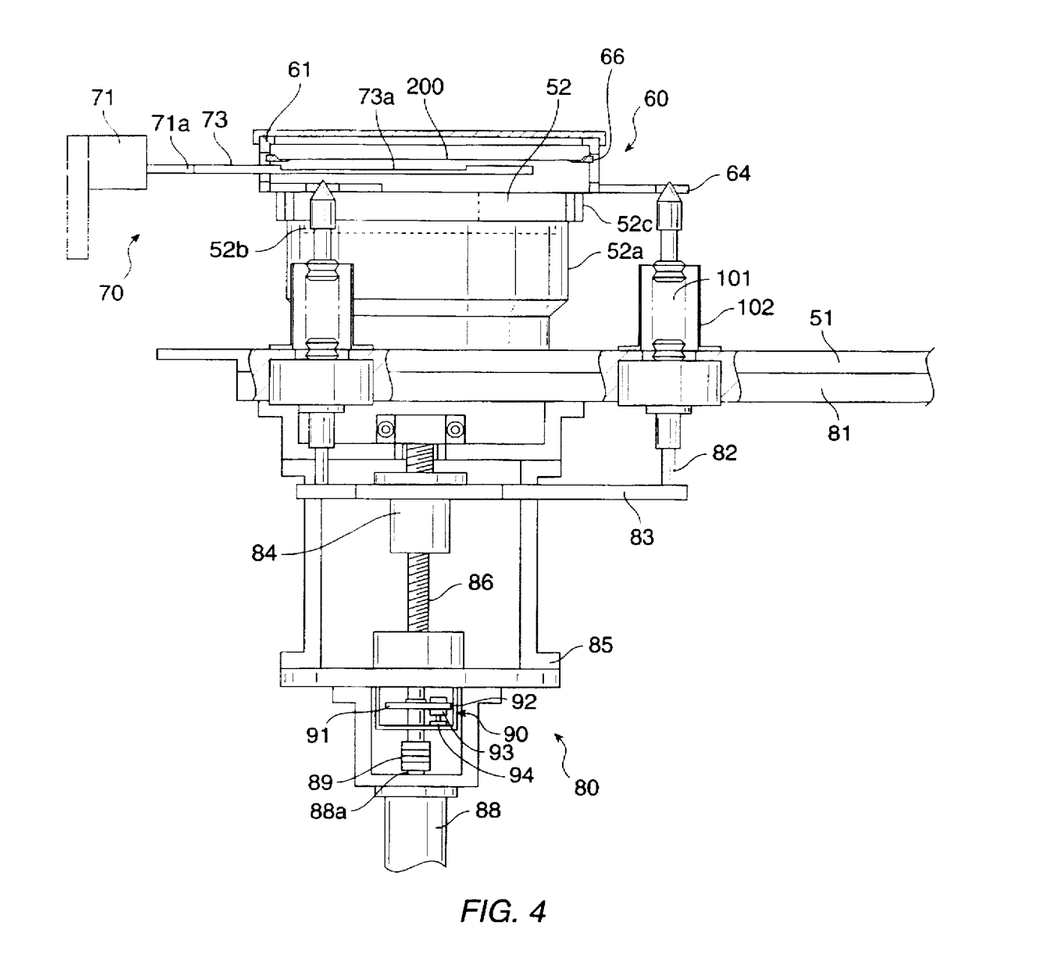
FIG. 4 is a partial sectional view of the apparatus for thermal treatment of thin film according to the present invention.

The apparatus for the thermal treatment of thin film according to the present invention supplies a wafer to a heater block 52, thermal treats the wafer to a predetermined temperature, and thereafter, removes the heat treated wafer. Thus, as illustrated in FIGS. 3 and 4, the present invention comprises a vacuum chamber 51, a heater block 52 secured inside the vacuum chamber 51, a holding clamp 60 for supporting the wafer 200 by a plurality of fingers 66 positioned in the holding clamp and for receiving the heater block 52. The holding clamp 60 is an open-ended cylinder supported by a plurality of axially moveable rods 82. Thus, once a wafer is positioned on the fingers of the holding clamp, the rods 82 supporting the holding clamp are lowered enabling the holding clamp to move toward the heater block 52 whereupon the heater block enters the holding clamp and engages the underside of the wafer and supports the wafer. Upon further lowering of the rods 82, the circumferential threshold of the holding clamp engages the edge of the wafer and upon further lowering of the rods 82 the weight of the holding clamp is placed against the edge of the wafer which, in turn, is supported by the heater block 52. The elevator means 80 elevates and lowers the holding clamp.

The heater block 52 is secured to the chamber 51 by a support 52a. The heater 52b of the heater block is operatively secured to the bottom surface of the heater block 52 or inside the heater block 52. A plurality of through holes (not shown) for supplying gas are formed in the heater 52b. Guide grooves 52c are vertically formed in the peripheral surface of the heater block 52 to permit the heater block 52 to contact the wafer, i.e. provide clearance for each respective finger of the holding clamp 60, at the time the holding clamp 60 is being lowered.

Figure 5A:
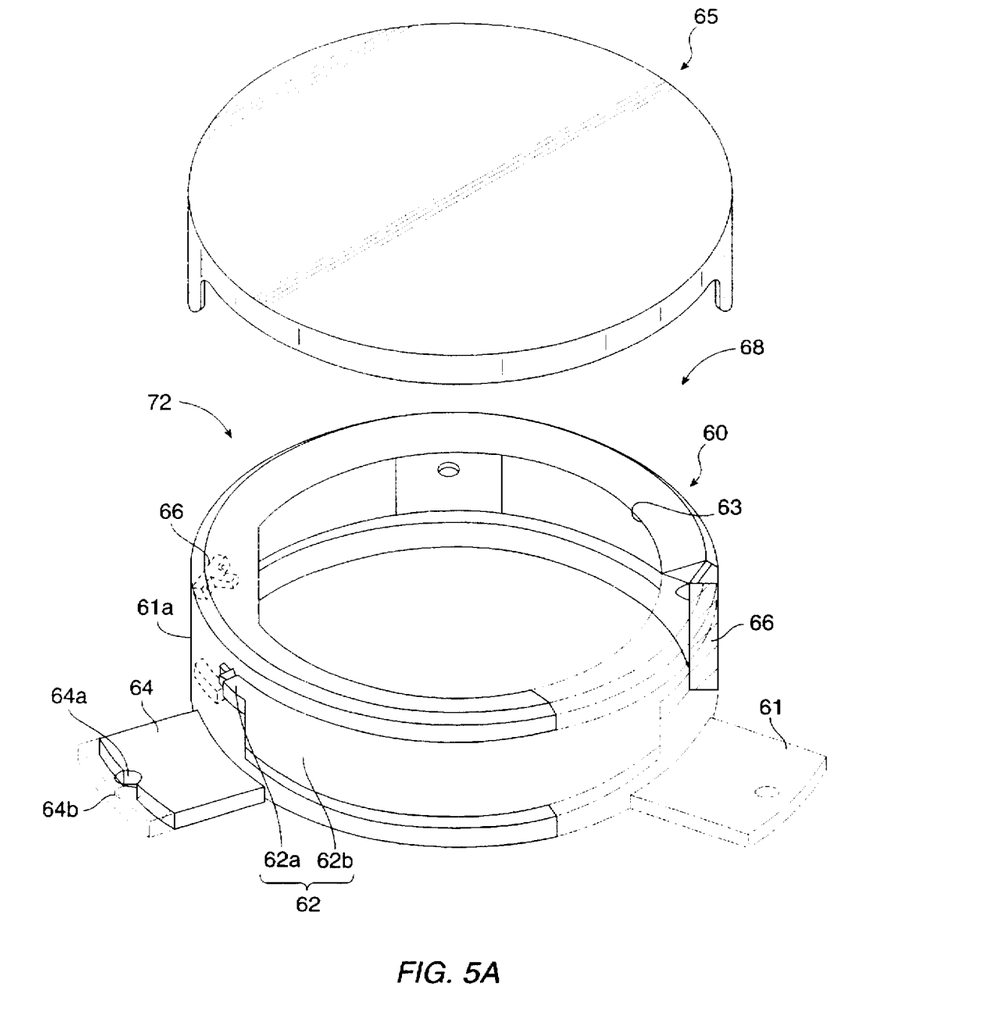
FIG. 5A is an exploded perspective view of the holding clamp 60 according to the present invention.

An aperture 62 is formed in the peripheral wall 61a of the main body 61 of the holding clamp 60, as shown in FIG. 5A, through which an arm 73 of the wafer supply means 70 having a wafer positioned thereon may pass through to position on or to remove from the fingers of the holding clamp a wafer. The upper edge 68 of the main body 61 includes a circumferential flange 63 which extends a predetermined length from the edge 68 toward the center of the main body 61 in order to contact, in use, the periphery of the wafer during heat treatment. The size of aperture 62 is sufficient to permit the passage of the wafer 200 and the arm 73 of the wafer supply means. Thus, aperture 62 includes, for example, a second hole 62b formed in the peripheral wall 61a of the main body to permit the arm 73 to pass with a pair of first holes 62a formed from the second hole in the peripheral wall 61a and extending away from the second hole to accommodate the size of the wafer as illustrated in FIG. 5A. Opposite the aperture 62 formed in the wall 61a of the main body 61 a like aperture 62 is formed to accommodate the arms 73 of the wafer supply means, as illustrated in FIGS. 3 and 5A.

Figure 5B:
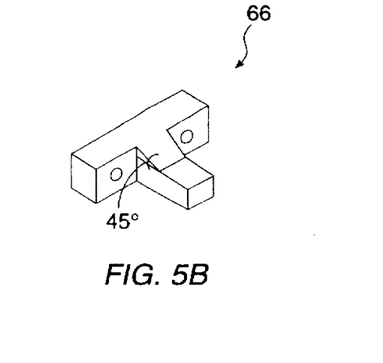
FIG. 5B is a perspective view of a finger 66 according to the present invention.

The holding clamp is supported by at least three support members 64 radially positioned about the main body and having a predetermined angular interval, as seen in FIG. 5A. Each support member 64 includes a support opening 64a formed therein for receiving an end of the rod 82 of the elevator means 80. Preferably, the support hole 64a is enlarged 64b with the angle of enlargement being about 90 degrees, resulting in a cone shaped opening for receiving a cone shaped end of rod 82. The means for holding the wafer 72 include a plurality of fingers 66 support the wafer 200 supplied by the arm 73 and are positioned on the interior circumferential surface of the holding clamp 60. Each finger 66 is preferably equally positioned between the first hole 62a and the second hole 62b, on the inner circumferential surface of the holding clamp 60 and preferably includes a set screw to permit the working position to be changed, if desired. Further, each of the fingers include an upper surface with an inclined step (about 45 degrees), as illustrated at FIG. 5b.

A cap 65 is positioned on the clamp top edge 68 to cover the holding clamp to assist in controlling heat radiation. The configuration of the cap 65 may include an opening(s) formed therein to permit access to the aperture 62, as seen in FIG. 5A.

The wafer supply means 70 is operatively positioned in front of the aperture 62 formed in the clamp 60, and comprises an actuator 71 having a rod 71a to which is secured an arm 73 which is provided with a wafer support 73a.

The elevator means 80 illustrated at FIG. 3 selectively moves the holding clamp 60 relative to the heater block 52, and comprises a base plate 81 secured to the lower surface of the bottom surface of the chamber 51 (in which the support 52a of the heater block 52 is installed), and at least three rods 82 vertically slidingly positioned at the base plate 81. A support plate 83 interconnects the ends of each rod 82 exposed below the bottom surface of the chamber 51. A transfer member 84 is secured to the center of the support plate 83. A ball screw 86 with the transfer member 84 are supported by a bracket 85 secured to the lower surface of the base plate 81. An actuator 88 is secured to the lower surface of the bracket 85 to rotate or counter-rotate the ball screw 86. A brake means 90 is positioned at the lower end of the ball screw 86 to prevent the ball screw 86 from rotating by inertial force.

The end of each rod 82 is tapered to form an angle of about 90 degrees and is positioned vertically below each support hole 64a and engages each support hole 64a provided at the end of each support 64 of the holding clamp 60, respectively. The support plate 83 which interconnects the ends of the rod is preferably of a triangle or a disk shape. The ball screw 86 and a rotation shaft 88a of the actuator 88 are connected by a flexible coupling 89. A bellows 101 is installed at the sliding portion between the base plate 81 fixed to the chamber and the rod 82. A shield 102 is fixed to the bottom surface of the chamber 51 and encloses the bellows 101. The actuator preferably utilizes a servo motor or hydraulic motor.

In the brake means 90, a disk 91 is secured to the lower end of the ball screw 86. A support bracket 92 is secured to the bracket 85 and positioned at the side of the brake means 90 adjoining the disk 91. A solenoid 94 is used to push a pad 93 (installed on a rod of the brake means 90, as seen in FIG. 4) against the disk 91 upon activation of the actuator 88.

A detailed explanation of the operation of the apparatus for the thermal treatment of thin film according to the present invention constructed as described above, follows.

For the thermal treatment of the wafer 200 by utilizing the apparatus according to the present invention, firstly the actuator 88 of the elevator means 80 is operated to rotate the ball screw 86, thereby rotating the transfer member 84 threadably connected to the ball screw 86 to raise the support plate 83. As the support plate 83 is raised, the rods 82 travel toward the supports whereupon the end of rod is inserted into the support hole 64a provided at each support of the clamp 60. In this condition, as the support plate 83 is raised further, the holding clamp 60 is raised above the heater block 52. In this condition, the actuator 71 of the wafer supply means 70 is operated and the wafer 200 positioned on the support 73a of the arm 73 connected to the rod 71a of the actuator 71 is inserted into the aperture 62 of the holding clamp. At this time, the wafer 200 supported by the support 73a is positioned above the plurality of fingers 66. When the insertion of the wafer 200 by the support 73a is completed, the actuator 71 of the wafer supply means 70 is lowered to lower the arm 73, or the elevator means 80 is raised, to a predetermined height to lower the arm 73 to the second hole 62b so that the wafer 200 supported by the support 73a is now supported by the plurality of fingers 66 fixed to the inner surface of the clamp 60. When the wafer 200 is supported by the fingers 66, the actuator is operated to withdraw the arm 73 out of the aperture 62.

In the above described procedure, if the actuator 88 stops due to a cutoff of electrical power or mechanical failure of the actuator 88, the solenoid 94 of the brake means 90 is activated and pushes the pad 93 against the disk 91 to prevent the rod 82 from rising and the transfer member 84 from operating due to the difference in pressure between the inside and outside of the chamber.

When the wafer 200 is supported by the fingers 66 of the clamp 60, the actuator 88 of the elevator means 80, supported by the bracket 85, is operated to rotate the ball screw 86. As the ball screw 86 is rotated, the transfer member 84 is lowered, lowering the support plate 83 so that the rods 82 are lowered. As the rods 82 are lowered, the holding clamp 60 is lowered to receive the heater block 52 through the bottom with the fingers 66 of the clamp 60 passing along the guide grooves 52c formed on the outer circumferential surface of the heater block 52 so that the wafer 200 supported by the fingers 66 is then placed on top of the heater block 52.

With the wafer 200 placed on top of the heater block 52, if the rod 82 is further lowered, the circumferential flange 63 formed at the upper edge of the holding clamp 60 pushes against the edge of the wafer 200 seated on the heater block. In this condition, the actuator 88 is operated so that the end of the rod 82 is separated from the support hole 64a provided on the support 64 of the clamp 60. In this way, the circumferential flange 63 of the clamp 60 pushes against the edge of the wafer 200 by weight of the clamp 60. Therefore, deformation or breakage of the wafer due to excessive clamping force of the wafer 200 against the heater block 52 is eliminated.

The wafer 200 is then thermally treated by the heater block 52 with the wafer 200 positioned thereon as described above. Using the apparatus of the present invention, the wafer 200 can be uniformly heated to a uniform temperature since the cap positioned at the top of the holding clamp 60 seals the opening of the holding clamp to prevent the heat generated by the heater block 52 from being radiated into the inside of the chamber.

Upon completion of the thermal treatment of the wafer 200 as described above, the wafer 200 seated on the heater block 52 is removed. A detailed explanation of the removal process follows.

To remove the wafer 200, the actuator 88 of the elevator means 80 is operated to raise the ball screw 86 and the support plate 83 (supported on the transfer member 84 combined with the ball screw 86) so that the end of the rod 82 (supported by the support plate 83) is inserted into the support hole 64a of the support 64 of the clamp 60. In this condition, the rod 82 is freer raised, raising the clamp 60. When the clamp 60 is raised, the clamping of the wafer by the circumferential flange 63 is released. The fingers 66 formed on the inner circumferential surface of the clamp 60 now move along the guide grooves 52c formed on the circumferential surface of the heater block 52 so that the fingers 66 touches the edge of the wafer and support the wafer 200. In the condition described above, if the second hole 62b of the aperture 62 formed in the peripheral surface of the clamp 60 is positioned in front of the arm 73 of the wafer supply means 70 as the clamp 60 is further raised by the rod 82, the actuator 88 of the elevator means 80 is stopped, thereby stopping the movement of the rods 82. Then the actuator 71 of the wafer supply means 70 is operated to insert the arm 73 into the second hole 62b so that the wafer support 73a provided at the end of the arm 73 is placed below the wafer 200 supported by the finger 66. In this condition, the clamp 60 is lowered by lowering the rod 82 by operating the actuator 88 of the elevator means 80 or the wafer supply means is raised by a certain distance, so that the wafer 200 supported by the fingers 66 is now supported by the wafer support 73a of the arm 73. Then the actuator 71 is again operated to remove the arm 73 out of the aperture 62 to pull out the wafer.

As described above, the apparatus for the thermal treatment of a wafer according to the present invention prevents the deformation of the wafer due to the elevation of, supplying to and removal of the wafer from the heater block and also can basically solve the occurrence of the poor quality of the wafer due to the clamping force since the clamping of the wafer against the heater block is achieved by only the weight of the clamp. Also, the deformation of the wafer due to the wafer supporting force at the time of elevation of the wafer to and away from the heater block can be prevented, plus the wafer can be heated to uniform temperature utilizing the apparatus according to the present invention.

By the use of the means for holding the wafer 72, the wafer is precisely positioned on the heater block for thermal treatment and yet can be easily positioned and removed for such treatment.

Although this invention has been described in its preferred from with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. An apparatus for thermal treatment of a thin plate wafer having a peripheral edge, comprising:

a vacuum chamber;

a heater block for heating the thin film wafer rigidly mounted and operatively positioned inside said vacuum chamber;

a holding clamp positioned in said vacuum chamber and defining an open-ended cylinder having a bottom and a top, said bottom for receiving said heater block, said holding clamp for pressing against said wafer supported by said heater block;

means for holding the wafer in said open-ended cylinder to enable said holding clamp to hold the wafer prior to and subsequent to thermal treatment of the wafer;

an elevator means for positioning said holding clamp relative to said heater block such that in use only said weight of said holding clamp presses against the wafer; and mechanical means co-operating with the elevator means for supplying and removing wafers into and out of the apparatus.

2. The apparatus of claim 1 for thermal treatment of a thin plate wafer wherein said apparatus further includes a wafer supply means for supplying said wafer to, positioning said wafer on and removing said wafer from said holding clamp.

3. The apparatus of claim 2 for thermal treatment of a thin plate wafer wherein said wafer supply means comprises an actuator operatively connected to an arm with said arm terminating in a wafer support.

4. The apparatus for thermal treatment of a thin plate wafer of claim 1 wherein said open-ended cylinder further includes an inner surface and said means for holding said wafer in said open-ended cylinder comprises a plurality of fingers positioned on said inner surface of said open-ended cylinder for supporting the peripheral edge of the wafer to permit, in use, said holding clamp to hold said wafer prior to and subsequent to thermal treatment of said wafer; and said top of said open-ended cylinder further including a circumferential flange such that, in use, activation of said elevator means moves said holding clamp toward said heater block, whereby said heater block enters said bottom of said holding clamp and contacts said wafer held by said holding clamp until said heater block supports said wafer and upon continued activation of said elevator means said circumferential flange of said holding clamp engages the peripheral edge of the wafer and upon further continued activation of said elevator means said circumferential flange of said holding clamp engages the peripheral edge of the wafer whereby said weight of said holding clamp presses against the peripheral edge of said wafer and is entirely supported by said heater block 52.

5. The apparatus for thermal treatment of a thin plate wafer of claim 1 wherein said top of said open-ended cylinder further includes a cap positioned thereon to prevent, in use, heat radiation.

6. The apparatus for thermal treatment of a thin plate wafer of claim 1 wherein said open-ended cylinder further includes at least one aperture formed therein to permit placing and positioning therethrough of said thin plate wafer on a plurality of fingers and removal therethrough of said thin plate wafer from said plurality of fingers.

7. An apparatus for thermal treatment of a thin plate wafer having a peripheral edge, comprising:

a vacuum chamber;

a heater block for heating the thin film wafer rigidly mounted and operatively positioned inside said vacuum chamber;

a holding clamp positioned in said vacuum chamber and defining an open-ended cylinder having a bottom and a top, said bottom for receiving said heater block, said holding clamp for pressing against said wafer, supported by said heater block;

means for holding the wafer in said open-ended cylinder to enable said holding clamp to hold the wafer prior to and subsequent to thermal treatment of the wafer;

an elevator means for positioning said holding clamp relative to said heater block such that in use only said weight of said holding clamp presses against the wafer;

a base plate securely positioned at a lower surface of a bottom surface of said vacuum chamber;

at least three rods extending vertically and slidably secured to said base plate;

a support plate for interconnecting each end of each rod exposed below said bottom surface of said vacuum chamber with said support plate having a center;

a transfer member fixed at said center of said support plate;

a ball screw operatively combined with said transfer member and supported by a bracket having a lower surface and being secured to said lower surface of said base plate; and an actuator secured to said lower surface of said bracket to rotate or counter-rotate said ball screw.

8. The apparatus for thermal treatment of a thin plate wafer of claim 7 wherein said apparatus further comprises a brake means positioned at a lower end of said ball screw to prevent the rotation of said ball screw in response to a rotational force applied to said transfer member due to a pressure difference between pressure inside said vacuum chamber and pressure outside said vacuum chamber.

9. The apparatus for thermal treatment of a thin plate wafer of claim 8 wherein said brake means comprises a disk installed at said lower end of said ball screw; and a solenoid secured proximate said disk for moving a pad to frictionally engage said disk.

10. An apparatus for thermal treatment of a thin plate wafer having a peripheral edge, comprising:

a vacuum chamber;

a heater block for heating the wafer operatively positioned inside said vacuum chamber;

a holding clamp positioned in said vacuum chamber and defining an open-ended cylinder having a bottom and a top, with said top of said open-ended cylinder further including a circumferential flange and with said bottom for receiving said heater block therethrough wherein the weight of said holding clamp presses against the wafer, the wafer being supported by said heater block;

means for holding the wafer prior to and subsequent to thermal treatment of said wafer; and an elevator means including a generally central ball screw for moving said holding clamp toward and away from said heater block such that activation of said elevator means moves said holding clamp toward said heater block, said heater block enters said bottom of said holding clamp and contacts the wafer held by said holding clamp until said heater block supports said wafer and upon continued activation of said elevator means said holding clamp is in direct contact with the peripheral edge of the wafer and is entirely supported by said heater block.

11. The apparatus for thermal treatment of a thin plate wafer of claim 10 wherein said open-ended cylinder further includes an inner surface and said means for holding said wafer in said open-ended cylinder comprises a plurality of fingers positioned on said inner surface of said open-ended cylinder for supporting said peripheral edge of the wafer to permit, in use, said holding clamp to hold said wafer prior to and subsequent to thermal treatment of said wafer.

12. The apparatus for thermal treatment of a thin plate wafer of claim 10 wherein said top of said open-ended cylinder further includes a cap positioned thereon to prevent, in use, heat radiation.

13. The apparatus for thermal treatment of a thin plate wafer of claim 10 wherein said open-ended cylinder further includes at least one aperture formed therein to permit placing and positioning therethrough of said thin plate wafer on a plurality of fingers and removal therethrough of said thin plate wafer from said plurality of fingers.

14. The apparatus of claim 10 further including a wafer supply means for supplying said wafer to, positioning said wafer on and removing said wafer from said holding clamp.

15. The apparatus of claim 14 wherein said wafer supply means comprises an actuator operatively connected to an arm with said arm terminating in a wafer support.

* * * * *